United States Patent [19]

Konishi et al.

[11] Patent Number: 5,310,446
[45] Date of Patent: May 10, 1994

[54] METHOD FOR PRODUCING SEMICONDUCTOR FILM

[75] Inventors: Junichi Konishi; Kouichi Maari, both of Ikeda; Toshihiko Taneda, Minoo; Akiko Kishimoto, Kawanishi, all of Japan

[73] Assignee: Ricoh Company, Ltd., Tokyo, Japan

[21] Appl. No.: 912,894

[22] Filed: Jul. 13, 1992

Related U.S. Application Data

[63] Continuation-in-part of Ser. No. 628,583, Dec. 17, 1990, abandoned.

[30] Foreign Application Priority Data

| Jan. 10, 1990 | [JP] | Japan | 2-3959 |
| Jan. 10, 1990 | [JP] | Japan | 2-3960 |
| Jan. 19, 1990 | [JP] | Japan | 2-10916 |
| Sep. 12, 1990 | [JP] | Japan | 2-243328 |

[51] Int. Cl.$^5$ .............................................. C30B 25/00
[52] U.S. Cl. .................................. 117/58; 148/DIG. 93; 437/86; 437/174; 117/54; 117/934; 117/923
[58] Field of Search ............. 148/DIG. 93, DIG. 135; 156/603, 612, DIG. 73, DIG. 105; 437/73, 174, 247, 248, 974

[56] References Cited

U.S. PATENT DOCUMENTS

| 3,771,026 | 11/1973 | Asai et al. | 317/234 R |
| 3,941,647 | 3/1976 | Druminski | 156/612 |
| 3,961,997 | 6/1976 | Chu | 148/174 |
| 3,996,095 | 12/1976 | Ahn et al. | 156/610 |
| 4,059,461 | 11/1977 | Fan et al. | 148/1.5 |
| 4,091,169 | 5/1978 | Bohg et al. | 428/428 |
| 4,180,618 | 12/1979 | Alpha et al. | 428/428 |
| 4,292,091 | 9/1981 | Togei | 437/173 |
| 4,292,730 | 10/1981 | Ports | 257/538 |
| 4,396,456 | 8/1983 | Cook | 156/602 |
| 4,415,383 | 11/1983 | Naem et al. | 437/174 |
| 4,437,139 | 3/1984 | Howard | 361/313 |
| 4,472,234 | 9/1984 | Shibata et al. | 257/74 |
| 4,523,962 | 6/1985 | Nishimura | 427/53.1 |
| 4,545,823 | 10/1985 | Drowley | 148/1.5 |
| 4,643,950 | 2/1987 | Ogura et al. | 428/446 |
| 4,659,587 | 4/1987 | Imura et al. | 427/53.1 |
| 4,717,681 | 1/1988 | Curran | 257/197 |
| 4,727,047 | 2/1988 | Bozler et al. | 437/89 |
| 4,732,801 | 3/1988 | Joshi | 428/198 |
| 4,752,590 | 6/1988 | Adams et al. | 437/84 |
| 4,794,445 | 12/1988 | Homma et al. | 257/508 |
| 4,795,679 | 1/1989 | Ramesh et al. | 428/428 |

(List continued on next page.)

FOREIGN PATENT DOCUMENTS

| 0047140 | 8/1981 | European Pat. Off. . |
| 0057135 | 8/1982 | European Pat. Off. . |
| 0078681 | 10/1982 | European Pat. Off. . |
| 3508469 | 3/1985 | Fed. Rep. of Germany . |
| 3620300 | 6/1986 | Fed. Rep. of Germany . |
| 234529 | 2/1985 | German Democratic Rep. . |
| 56-38057 | 4/1981 | Japan . |
| 59-175721 | 10/1984 | Japan . |

(List continued on next page.)

OTHER PUBLICATIONS

B-Y. Tsaur, et al., "Stress-enhanced carrier mobility in zone melting recrystallized polycrylline si films on Si-O$_2$-coated substrates", Appl. Phys. Lett. 40(4), Feb. 15, 1982, pp. 322-324.

(List continued on next page.)

Primary Examiner—Olik Chaudhuri
Assistant Examiner—Felisa Garrett
Attorney, Agent, or Firm—Cooper & Dunham

[57] ABSTRACT

A method for producing a semiconductor film comprising steps of: preparing a first substrate and a second substrate; superposing the first substrate on the second substrate to form an assembly of combined substrates; applying energy to the assembly of combined substrates to melt a portion within the assembly to form a molten portion therein; cooling the molten portion to crystallize the portion to form a single crystal structure therein; and separating the first substrate from the second substrate. The method makes it possible to control the crystal axis orientation of the recrystallized single crystal structure.

19 Claims, 11 Drawing Sheets

U.S. PATENT DOCUMENTS

| | | |
|---|---|---|
| 4,819,037 | 4/1989 | Sakakibara et al. ................ 437/173 |
| 4,822,751 | 4/1989 | Iahizu et al. ......................... 437/173 |
| 4,822,752 | 4/1989 | Sugahara et al. ................... 437/174 |
| 4,826,785 | 5/1989 | McClure et al. .................... 437/174 |
| 4,847,157 | 7/1989 | Goodman et al. ................... 428/426 |
| 4,885,052 | 12/1989 | Fan et al. ......................... 156/620.7 |
| 4,915,772 | 4/1990 | Fehlner et al. ................... 156/620.7 |
| 4,984,048 | 1/1991 | Sagara et al. ........................ 257/538 |
| 4,990,464 | 2/1991 | Baumgart et al. .................... 437/83 |
| 5,060,041 | 10/1991 | Haga ..................................... 357/30 |
| 5,066,610 | 11/1991 | Chen et al. ............................ 437/83 |
| 5,073,815 | 12/1991 | Kosaka et al. ......................... 357/67 |
| 5,108,843 | 4/1992 | Ohtaka et al. ...................... 428/446 |
| 5,173,446 | 12/1992 | Asakawa et al. .................... 437/111 |

FOREIGN PATENT DOCUMENTS

| | | |
|---|---|---|
| 61-63019 | 4/1986 | Japan . |
| 61-97964 | 5/1986 | Japan . |
| 61-102723 | 5/1986 | Japan . |
| 62-40858 | 8/1987 | Japan . |
| 62-219510 | 9/1987 | Japan . |
| 63-65641 | 3/1988 | Japan . |

OTHER PUBLICATIONS

W. G. Hawkins, et al., "Growth of single-crystal silicon islands on bulk fused silica by $CO_2$ laser annealing", Appl. Phys. Lett. 40(4), Feb. 15, 1982, pp. 319–332.

S. A. Lyon, et al., "Microstrain in laser-crystallized silicon islands on fused silica", Appl. Phys. Lett. 40(4), Feb. 15, 1982, pp. 316–318.

METHOD FOR PRODUCING SEMICONDUCTOR FILM

CROSS-REFERENCE TO RELATED APPLICATION

This application is a continuation-in-part of application Ser. No. 628,583 filed Dec. 17, 1990, which is now abandoned.

BACKGROUND OF THE INVENTION

1. Field of the Invention

The present invention relates to a method for producing a single crystalline semiconductor film formed on an insulation base member for fabricating an electronic circuit thereon, which film is constituted from so called SOI (Silicon on Insulator) structure made from a single crystalline silicon film. More particularly, the invention relates to a semiconductor film producing method which is so called a recrystallization method in general.

The single crystalline silicon film produced in accordance with the present invention can be applied to various electronic devices, such as an active matrix liquid crystal display device, a high density LSI, a high dielectric breakdown device, a radiation proof device, and a three-dimensional integrated circuit.

2. Description of the Related Art

The SOI structure can be made by various methods such as a recrystallization method, an epitaxial growth method, an insulation layer embedding method, and a laminating method. Such SOI structure forming techniques in general are disclosed in detail in "SOI Structure Forming Technique" issued from Sangyo Tosho Co., Ltd., 1987.

As one of the recrystallization methods, a laser beam recrystallization method has been used, wherein a polycrystalline or amorphous silicon film formed on an insulation base plate is molten by using laser beam energy and wherein crystal is grown in the molten portion while moving the portion.

There have been made various attempts to improve the temperature distribution in the film to be irradiated by the laser beam to form a single crystalline film as follows.

One of the attempts is such that a plurality of laser sources are arranged to improve the temperature distribution in the laser spot.

Another attempt is such that an antireflection film or an optical absorption film is formed on the film sample surface to change the absorption ratio of the laser beam so as to improve the temperature distribution in the film.

A further attempt is such that the structure of the sample is constructed so that the heat radiation therefrom is changed spatially so as to improve the temperature distribution in the film.

In accordance with the laminating method, the film of SOI structure is formed in such a way that a pair of single crystal silicon substrates each having an oxide film formed thereon are faced together with the oxide films thereof being sandwiched and in contact with each other between the substrates, and that the substrates are heated to about 700° C. in an oxidation atmosphere so as to bond the substrates together, and after that one of the substrates is etched to a predetermined thickness by an etching back method.

In the event that a silicon film is formed on a glass plate or an insulation film and that the silicon film is molten and recrystallized to form a single crystal film thereon, due to that there are no seed portions for the single crystal in the film, the crystal axes of the single crystal film are uncontrollably rotated so that it becomes difficult to obtain a single crystal film having a desired crystal axis orientation.

With regard to the laminating method, when the dry etching process is adopted to etch the silicon substrate, the etching time is elongated, resulting in the reduction of through-put and the element forming surface is damaged. On the other hand, when the wet etchin process is adopted to etch the silicon substrate, evenness of the film thickness is impaired and it becomes necessary to arrange a mask on the other silicon substrate not to be etched.

SUMMARY OF THE INVENTION

It is therefore an object of the present invention to provide a method for producing a single crystalline silicon film having an improved crystalline characteristic by controlling the crystal axis of the crystalline film by supplying with seed from outside.

Another object of the present invention is to provide a method for producing a single crystalline silicon film wherein the film having an improved crystalline characteristic is selectively and effectively formed in such a way that a single crystalline silicon film is selectively grown on a substrate and that the substrate is used for recrystallization of the other substrate for forming the single crystalline silicon film on the substrate.

Above-mentioned object of the present invention can be achieved by a method for producing a semiconductor film comprising steps of:

(a) preparing a first substrate and a second substrate;

(b) superposing the first substrate on the second substrate to form an assembly of combined substrates;

(c) applying energy to the assembly of combined substrates to melt a portion within the assembly to form a molten portion therein;

(d) cooling the molten portion to crystallize the portion to form a single crystal structure therein; and (e) separating the first substrate from the second substrate.

In accordance with the present invention, the film is produced in such a way that a first substrate having a surface at least a part of which is constituted from a single crystal structure is arranged to be in contact with a second substrate having an insulation surface or a polycrystalline or amorphous silicon surface so that the first substrate surface is in direct contact with the second substrate surface and that the silicon film is molten and recrystallized in the state wherein the first and second substrate surfaces are in direct contact together, and after that the substrates are separated from each other.

The first substrate may be the one having a single crystalline film formed on the surface thereof. And the second substrate may be the one comprising an insulation base plate on which a polycrystalline or amorphous silicon film is formed. A single crystalline silicon film can be formed on the first substrate by an epitaxial growth process. The first substrate is for instance made from sapphie. The single crystalline silicon film is selectively formed on the first substrate surface so that the single crystalline silicon film can be selectively formed on the second substrate surface.

The first substrate may be composed of only a sapphire substrate.

In order to easily form a single crystalline silicon film on the second substrate after the melting and recrystallizing process, an insulating film which is affinitive for the silicon film may be arranged directly under the polycrystalline or amorphous silicon film of the second substrate. Such an affinitive insulation film may be made from silicon nitride film for example. The affinitive film is well combined with and bonded to the silicon film due to its large affinity for the silicon film.

The first substrate may be constituted from the one having a single crystalline film selectively formed on the surface thereof. The second substrate may be constituted from the one having an insulation surface formed from the material which is more affinitive for silicon than the first substrate surface material.

The silicon film is molten by energy of, for example, a laser beam or other optical beams.

Due to the arrangement wherein the polycrystalline or amorphous silicon film of the second substrate is molten and recrystallized in the state that the silicon film is being in direct contact with the single crystal silicon film of the first substrate, it becomes possible to control the crystal axis orientation of the single crystal silicon film since the second substrate silicon film takes over the crystal axis orientation of the first substrate when it cooled and recrystallized after molten, with the first substrate crystal film functioning as seed for forming crystal nuclear of the recrystallized film.

Due to the arrangement wherein the first substrate is constituted only from a sapphire plate, the crystal characteristic of sapphire is transferred to the silicon film at the time of cooling and recrystallizing the polycrystalline or amorphous silicon film of the second substrate after molten by the energy beam. Therefore, it becomes possible to control the crystal axis orientation of the single crystal silicon film formed on the second substrate. For example, by using the sapphire plate having the crystal face of (1 1 0 2), it becomes possible to form a single crystal silicon film having the crystal face of (1 0 0). Also, by using the sapphire plate having the crystal face of (0 0 0 1), it becomes possible to form a single crystal silicon film having the crystal face of (1 1 1).

An SOS (Silicon on Sapphire) substrate which has a single crystal silicon film formed on a sapphire substrate is produced in such a way that the single crystal silicon film is formed by an epitaxial growth on the sapphire substrate by thermal decomposition of SiH$_4$ in an atmosphere of high temperature in a long time.

However, with that method for producing the SOS structure mentioned above, a problem of auto-dope of Al from the sapphire side arises.

The problem of auto-dope can be attenuated by constituting the first substrate from only a sapphire plate and using a laser beam, for example, as an energy beam so that the silicon film is molten and recrystallized in a short time.

Due to the arrangement wherein an electrically insulating film which has a strong affinity for the silicon film is directly disposed under the silicon film of the second substrate, it becomes possible to prevent the recrystallized silicon film from being separated from the second substrate and reattached to the first substrate at the time when the two substrates are separated from each other.

The single crystal silicon film of the first substrate may be molten and recrystallized in a state that silicon film is disposed in contact with the insulation surface layer of the second substrate, as mentioned above. In such an arrangement, the single crystal silicon film of the first substrate is recrystallized on the surface of the second substrate. By forming the insulation surface layer of the second substrate by, for instance, silicon nitride which has stronger affinity for silicon than the first substrate surface material, it becomes possible to prevent the recrystallized single crystal silicon film from separating from the second substrate and keep sticked thereon.

It is an advantage of the present invention that the crystal axis orientation becomes controllable since the single crystal formed on the second substrate takes over the crystal axis orientation of the single crystal of the first substrate in accordance with the arrangement mentioned above wherein the polycrystalline or amorphous silicon surface of the second substrate is molten and recrystallized in the state that the second substrate silicon surface is in direct contact with the first substrate surface which has a single crystal portion formed on at least a part thereof.

Also, the second substrate single crystal well takes over the first substrate single crystal axis orientation in accordance with the arrangement wherein the polycrystallin or amorphous silicon film is formed on an insulation layer of the second substrate, as mentioned above.

Also, the single crystal axis orientation can be well controlled in accordance with the arrangement wherein the first substrate is composed of a sapphire plate and the second substrate comprises an insulation base plate on which the silicon film to be molten and recrystallized is formed so that the crystal characteristic of the sapphire is transferred to the recrystallized silicon, as mentioned above.

Another advantage of the present invention is that the through-put of the production can be raised in accordance with the arrangement wherein an insulating film which has a strong affinity for the silicon is disposed directly under the silicon film of the second substrate, as mentioned above, since the recrystallized single crystal layer formed on the second substrate is kept unseparated therefrom at the time of separating the first and second substrates from each other.

Still another advantage of the present invention is that the element isolation process can be deleted since the SOI structure is formed in the state wherein the single crystal silicon film of the SOI structure has been patterned and the active region thereof has been isolated, by selectively preforming the single crystal film on the first substrate.

A further advantage of the present invention is that a high element isolation characteristic can be obtained since the break down voltage of the element isolation of the single crystal silicon film of the SOI structure of the present invention is high since the active regions are formed like dispersed islands.

The SOI structure surface is very important to determine the device characteristic. Therefore, it is a further advantage of the present invention that a high quality crystal can be obtained since the SOI structure surface can be formed on the sapphire plate by a gas phase process.

A still another advantage of the present invention is that the through-put of production is further raised by partly forming the single crystal silicon film on the sapphire plate so that the recrystallized silicon film is well separated from the sapphire plate without remaining thereon at the time of separating the sapphire plate from the second substrate, in comparison to the case wherein the single crystal silicon film is recrystallized all over the sapphire plate.

A further advantage of the present invention is that the production cost can be reduced since the sapphire plate can be repeatedly used, though sapphire itself is more expensive than silicon or glass.

Further objects and advantages of the present invention will be apparent from the following description of the preferred embodiments of the invention as illustrated in the accompanying drawings.

DESCRIPTION OF THE PREFERRED EMBODIMENTS

Figure 15A:
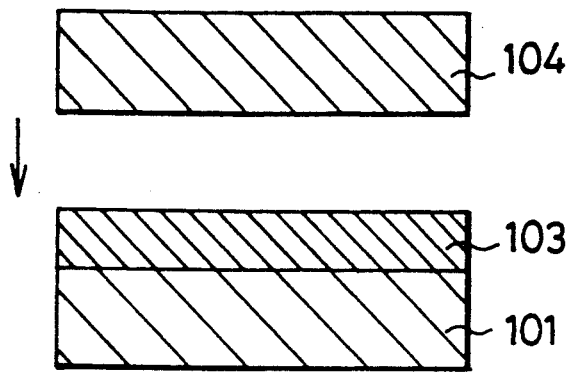
FIGS. 15a to 15c are sectional views of the structure at different steps in the flow of process for producing the single crystal silicon film in accordance with a preferred embodiment of the present invention.
Figure 15B:
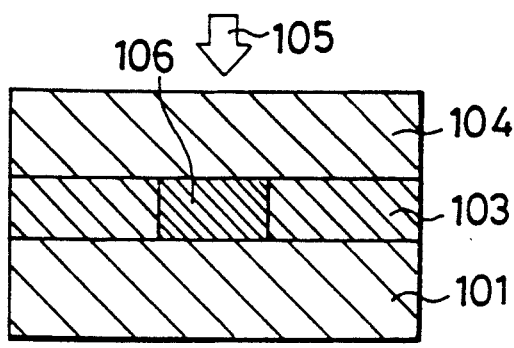
Figure 15C:
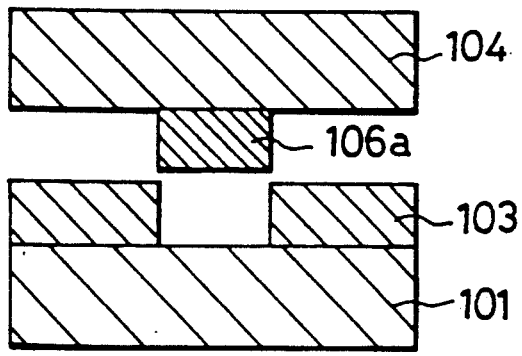

FIGS. 15a to 15c illustrate a preferred embodiment of the present invention.

FIG. 15a illustrates a sectional view of the structure at a step of the film producing flow of the embodiment. A silicon film 103 is formed on a single crystal substrate 101. On the other hand, a substrate 104 is provided.

FIG. 15b illustrates the structure at a step in the process subsequent to the process of FIG. 15a. The substrate 101 and the substrate 104 are combined together in such a manner that a surface of the silicon film 103 and a surface of the substrate 104 are faced and come in direct contact with each other.

After that, a laser beam 105 is irradiated to an assembly of the combined substrates from the side of the substrate 104, so a portion 106 of the silicon film 103 is molten. Then a crystalline form of the substrate 101 is transmitted to the portion 106 and the portion 106 is transformed into the single crystal during which the molten portion 106 is cooled, because the single crystal substrate 101 effectively functions as the seed of recrystallized silicon of the molten portion 106. And the portion 106 is closely contacted to the substrate 104.

FIG. 15c illustrates the structure at a step of process subsequent to the process of FIG. 15b. The substrate 104 on which a single crystal silicon film 106a is formed is removed from the substrate 101 on which a silicon film 103 is formed.

Accordingly, the silicon film 103 formed previously on the substrate 101 may be any film in crystallography, ex. an amorphous or a polycrystal.

It is to be noted that the laser beam 105 may be irradiated to the assembly of combined substrates from the side of the substrate 101 instead of the side of the substrate 104.

The various embodiments are described in detail in the following.

Figure 1A:
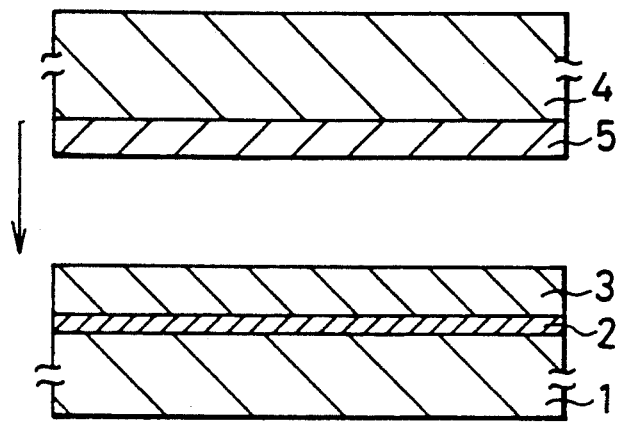
FIGS. 1a to 1c are sectional views of the structure at different steps in the flow of process for producing the single crystal silicon film in accordance with an embodiment of the present invention.
Figure 1B:
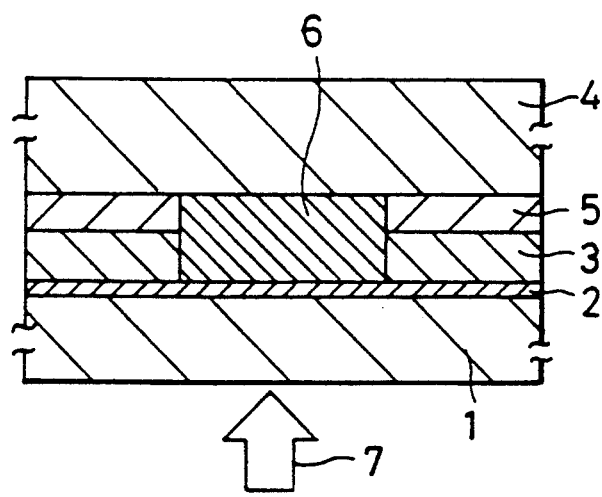
Figure 1C:
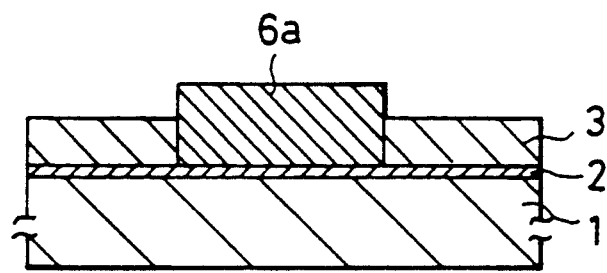

FIGS. 1a to 1c illustrate an embodiment of the present invention.

FIG. 1a illustrates a sectional view of the structure at a step of the film producing flow of the embodiment. On a glass substrate 1, a silicon nitride film 2 is deposited to about 100 to 200 Å thick by a CVD method. On the film 2, an amorphous silicon film 3 is deposited to about 1000 to 5000 Å thick by the CVD method. On the other hand, on a sapphire substrate 4, a single crystal silicon film 5 is deposited to about 3000 Å by an epitaxial growth method.

FIG. 1b illustrates the structure at a step in the process subsequent to the process of FIG. 1a. Before the process of FIG. 1b is carried out, the surface of the film 3 and the surface of the film 5 are cleaned. For example, the surfaces of the films are washed by an appropriate detergent such as buffered hydrofluoric acid to remove the oxide films spontaneously formed on the films 3 and 5.

After the detergent pretreatment, the substrates are combined together in such a way that the films 3 and 5 are faced and come in direct contact with each other.

After that, an argon ion laser beam 7 having power of about 4 W is irradiated to the combined substrate assembly from the under side of the glass plate 1. The combined substrate assembly is scanned by the laser beam 7 so that the irradiated portion 6 is molten and recrystallized to form a single crystal structure therein.

FIG. 1c illustrates the structure at a step of process subsequent to the process of FIG. 1b. The sapphire substrate 4 is removed from the glass substrate 1 on which a single crystal silicon film 6a is formed.

It is to be noted that the laser beam 7 (FIG. 1b) may be irradiated to the structure from the upper side of the sapphire substrate 4 instead of the lower side of the glass substrate 1.

In the event that the single crystal silicon film is recrystallized on the glass plate, it is desirable to use the laser beam to melt the silicon film on the glass plate. This is because the melting point of glass is for example about 1600° C. with respect to quartz glass and the melting point of silicon is up to about 1410° C. almost near that of glass, therefore, the glass plate should be kept at a low temperature as possible. In the event that the laser beam is used to heat and melt the film, the film is partly heated so that the glass plate is not heated to a very high temperature.

Figure 2:
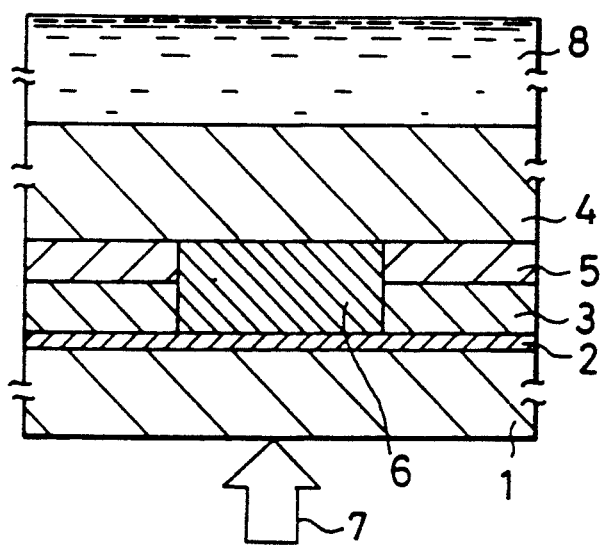
FIG. 2 is a sectional view of the structure at a step in the flow of process for producing the single crystal silicon film in accordance with another embodiment of the present invention.

FIG. 2 represents another embodiment of the present invention.

The same samples as in the case of the first embodiment, that is the sapphire substrate 4 and the glass substrate 1, are prepared. When the laser beam 7 is irradiated to the substrate assembly, a liquid cooling medium 8 is disposed in contact with the upper surface of the sapphire substrate 4. The cooling medium 8 may be composed of a liquid organic compound known itself as a surface active agent which has a relatively high vaporization point such as polyethylene glycol, polyethylene ether, polyethylene ester, and polypropylene oxide, etc.

Due to the cooling medium 8, the sapphire substrate 4 is more rapidly cooled so that the molten portion 6 is cooled from the sapphire plate side. Therefore, the silicon film 5 of the sapphire substrate 4 further effectively functions as the seed of the recrystallized silicon of the molten portion 6 so that the crystal axis orientation is further reliably controlled to be taken over from the film 5 to the recrystallized single crystal silicon.

In the above-mentioned embodiment of the present invention method, a silicon nitride film 2 is formed on the glass plate 1 and an amorphous silicon film 3 is formed on the film 2. The film 2 has a strong affinity for silicon. Therefore, after the silicon film is recrystallized, when the plates 1 and 4 are to be separated from each other, the recrystallized single crystal silicon film is prevented from being removed from the glass plate and transferred to the sapphire plate side. As the affinitive insulation film, a double-film structure comprising a silicon oxide film on which a silicon nitride film is formed may be used instead of the silicon nitride film 2 mentioned above. In that case, it is desirable that the silicon oxide film thickness be about 1000 Å and the silicon nitride film thickness be about 100 Å. Or otherwise, it may be possible to dispose only a silicon oxide film between the glass plate 1 and the amorphous silicon film 3. In this case, the silicon oxide film thickness is desirably about 1000 Å.

The polycrystalline or amorphous silicon film may directly formed on the glass plate without interposing the affinitive insulating layer mentioned above.

A polycrystalline silicon film may be formed on the glass plate instead of the amorphous silicon film 3 mentioned above.

When the laser beam 7 is to be irradiated from the sapphire plate side, the laser power may be determined considering the absorption coefficient and thickness of the sapphire plate.

By the scanning motion of the laser beam, the single crystal silicon film can be formed in a line or lines. Also, it is possible to form the recrystallized single crystal silicon in a wide area by widely scanning the substrate by the laser beam.

The sapphire plate 4 is more expensive than the glass plate. However, the sapphire plate is reusable by reforming the single crystal silicon film 5 by epitaxial growth on the sapphire plate after removing the remaining silicon film from the plate used in the last time process, since the film 5 is removed from the sapphire plate at the time of separating the plate from the glass plate after the recrystallization process, as mentioned above.

It may be possible to form a recrystallized single crystal silicon film on the second substrate by recrystallizing the single crystal silicon film of the first substrate in a state wherein the silicon film of the first substrate is in direct contact with the second substrate without forming the polycrystalline or amorphous silicon film thereon as in the case of the embodiments mentioned above.

Figure 3A:
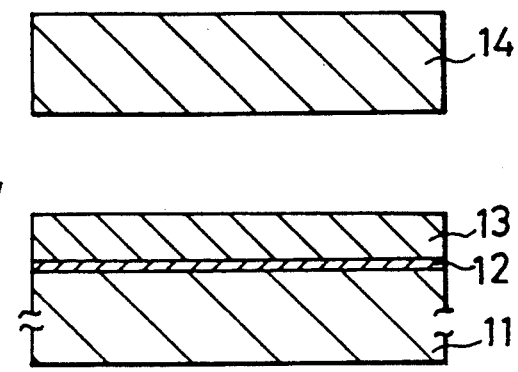
FIGS. 3a to 3c are sectional views of the structure at different steps in the flow of process for producing the single crystal silicon film in accordance with still another embodiment of the present invention.
Figure 3B:
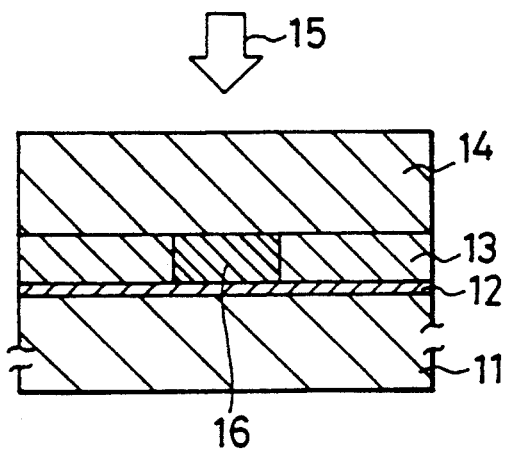
Figure 3C:
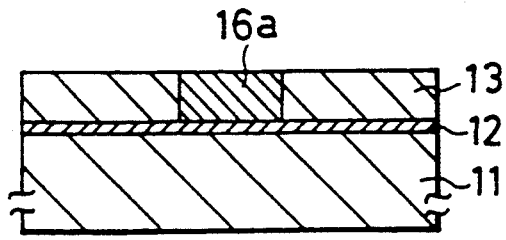

FIGS. 3a to 3c represent a further embodiment of the present invention.

FIG. 3a illustrates the structure at a step in a process in accordance with the embodiment of the invention. On a glass plate 11, a silicon nitride film 12 is formed by a CVD method to about 100 to 200 Å. On the film 12, an amorphous silicon film 13 is formed by the CVD method to about 1000 to 5000 Å. Numeral 14 designates a sapphire plate which is about 0.3 mm thick and prepared in addition to the glass plate 11.

FIG. 3b illustrates the structure at another step in a process in accordance with the embodiment of the invention. Before the step of FIG. 3b, the surface of the film 13 and the surface of the plate 14 are washed and cleaned by an appropriate detergent such as buffered hydrofluoric acid. After that, the film 13 and the plate 14 are arranged in direct contact with each other.

An argon ion laser beam 15 having output power of about 3 W is irradiated to the combined-plate assembly from the upper side of the sapphire plate 14. By the energy of the laser beam 15, the film 13 is molten. Numeral 16 designates the molten portion of the film 13. The molten portion 16 is cooled and crystallized to form a single crystal structure.

After that, as illustrated in FIG. 3c, the plate 14 is separated from the plate 11 so that a single crystal silicon film 16a is obtained on the plate 11.

It is to be noted that the laser beam may be irradiated from the under side of the glass plate 11.

Figure 4A:
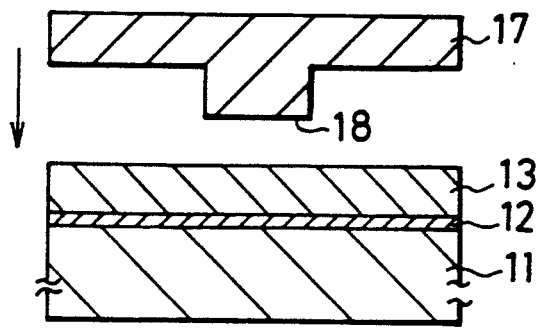
FIGS. 4a and 4b are sectional views of the structure at different steps in the flow of process for producing the single crystal silicon film in accordance with a further embodiment of the present invention.
Figure 4B:
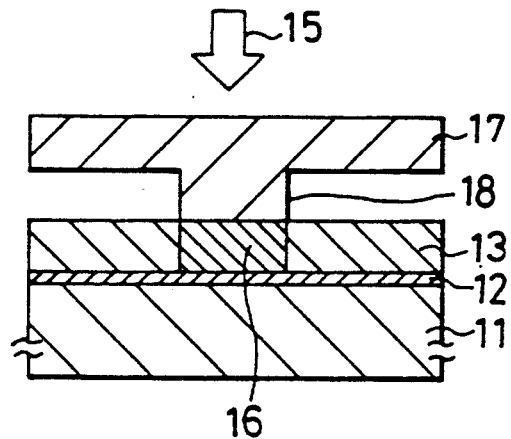

FIGS. 4a and 4b represent a still further embodiment of the present invention.

FIG. 4a illustrates the structure at a step of the process in accordance with the embodiment of the invention. On a glass plate 11, an amorphous silicon film 13 is formed through a silicon nitride film 12, as in the case of the embodiment of FIGS. 3. A sapphire plate 17 of this embodiment has a protruding portion 18 formed at a portion to come in contact with the film 13.

FIG. 4b illustrates the structure at another step of the process subsequent to the step of FIG. 4a. After the pretreatment of the plates so that the plate surfaces are cleaned, the plate 17 is superposed on the plate 11 so that the surface of the protruding portion 18 comes in direct contact with the surface of the film 13. In this state, the laser beam 15 is irradiated to the protruding portion 18 from the upper side of the plate 17 or from the lower side of the plate 11. By the laser beam energy, the film 13 is molten and cooled to be crystallized to form a single crystal structure.

After that, the plate 17 is removed from the plate 11.

In accordance with the arrangement mentioned above, wherein the sapphire plate 17 partly comes in contact with the film 13 of the plate 11 through the selectively formed protruding portion, it becomes possible to raise the reliability of contact between the two plates.

If all over the surface of the plate 17 is to be arranged in direct contact with the surface of the film 13 of the plate 11, the reliability of contact between the two surfaces may be lowered due to the warp or curve of the plates, which results in that the crystalline characteristic is not properly transferred from the sapphire plate to the recrystallized single crystal film. This point is attenuated by the arrangement wherein the plate 17 has the protruding portion 18 partly formed thereon at the selected portion where the single crystal film is to be recrystallized, thereby the reliability of contact between the two plates is raised so that the crystalline characteristic of the sapphire plate 17 is well transferred to the recrystallized single crystal portion.

Figure 5:
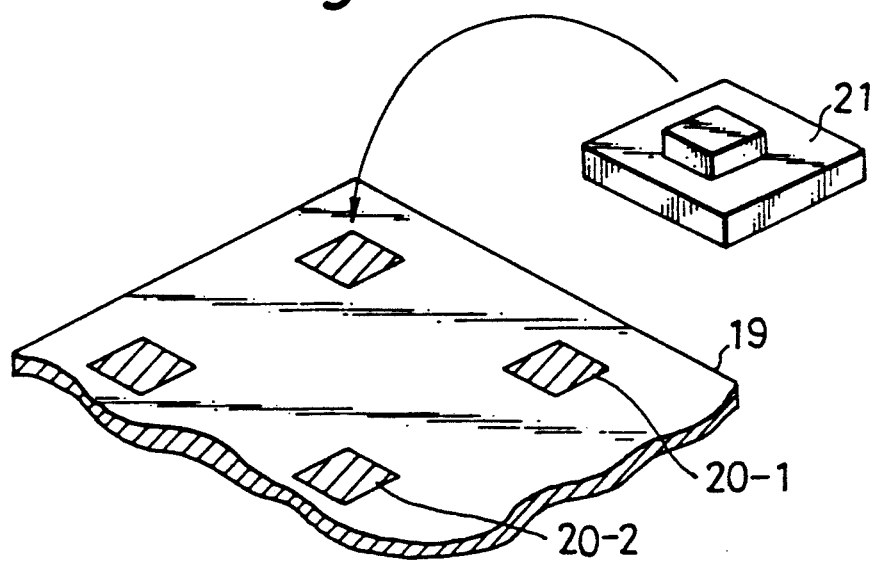
FIG. 5 is a perspective view of the structure at a step in the flow of process for producing the single crystal silicon film in accordance with a still further embodiment of the present invention.

FIG. 5 illustrates a substrate of a liquid crystal display device fabricated by the method in accordance with the present invention.

In the active matrix type liquid crystal displat device, it is necessary to form, on a glass plate, active elements such as thin film transistors or diodes in a matrix arrangement. When the active elements are formed from the amorphous silicon film, the carrying ability of carrier and the oxidation speed are not uniform spatially over the plate so that the characteristic of the transistor or diode becomes uneven or different for every product.

Therefore, to cope with the above mentioned problem, the single crystal silicon film is formed in such a way as follows in accordance with the embodiment of the present invention. First, an amorphous silicon film is formed on the glass plate 19 directly or through an insulation film such as a silicon nitride film. A sapphire plate 21 is superposed on the glass plate 19. The sapphire plate 21 has a protrusion at the portion corresponding to the active region where the thin film transistor or diode is to be formed. The protrusion of the plate 21 comes in direct contact with the silicon film surface of the plate 19. After that, a laser beam is irradiated to scan the protruding portion of the plate 21, as illustrated in FIG. 4b. Thereby, an active region 20-1 (FIG. 5) is molten and recrystallized to form a single crystal active area on the plate 19.

After that, the plate 21 is shifted onto an adjacent active region 20-2 where the above mentioned melting and recrystallizing process is repeated to form a single crystal active area in the region 20-2 on the plate 19.

As can be seen from FIG. 5, the sapphire plate 21 is small in comparison to the plate 19, therefore the cost as a whole is not so high though sapphire itself is expensive.

Figure 6:
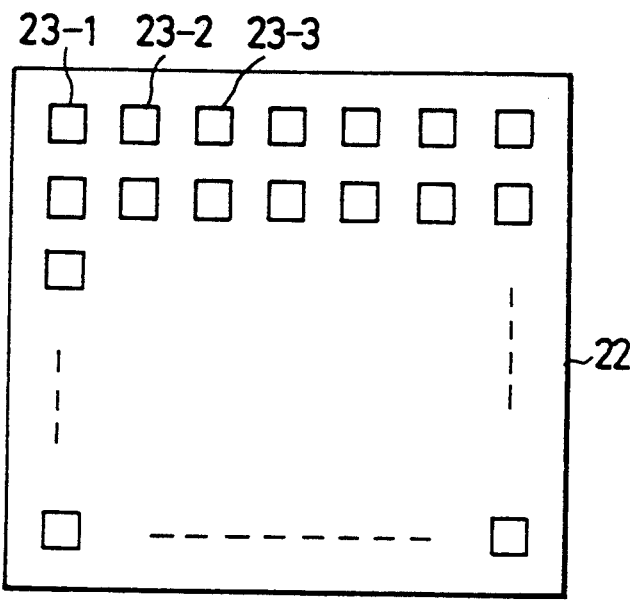
FIG. 6 is a plan view of the sapphire substrate in accordance with a still further embodiment of the present invention.

FIG. 6 illustrates a sapphire plate 22 which is suitably used for producing a substrate having a plurality of active regions formed thereon, such as the liquid crystal display substrate of FIG. 5.

A plurality of protrusions 23-1, 23-2, etc. are formed on the sapphire plate 22. On the other hand, an amorphous or polycrystalline silicon film is formed on the glass plate. The plate 22 is superposed on the glass plate so that each protrusion comes in direct contact with the surface of the silicon film on the glass plate. In such a state, the silicon film between the sapphire plate and the glass plate is irradiated and scanned through the plate by a laser beam so that the film is molten and recrystallized to form a single crystal silicon structure on the glass plate.

By using the sapphire plate having a plurality of protrusions as mentioned above, it becomes unnecessary to move the sapphire plate for every active region.

Figure 7:
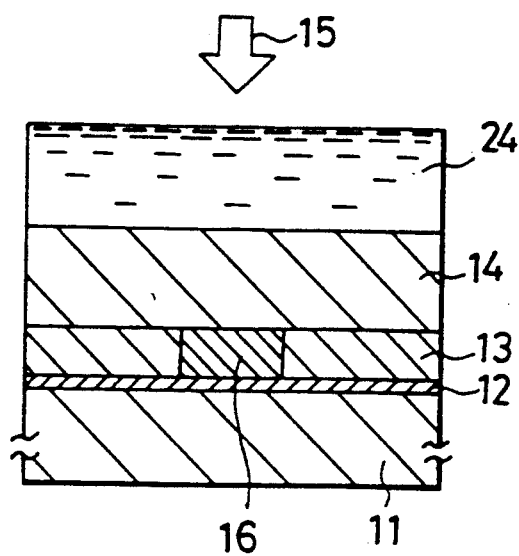
FIG. 7 is a sectional view of the structure at a step in the flow of process for producing the single crystal silicon film in accordance with a still further embodiment of the present invention.

FIG. 7 illustrates a still further embodiment of the present invention.

As in the case of the embodiment of FIG. 3, a sapphire plate 14 is superposed on the glass plate 11 on which an amorphous or polycrystalline silicon film 13 is formed through a silicon nitride film 12. A liquid cooling medium 24 such as polyethylene glycol is disposed on the upper side of the plate 14 in direct contact therewith.

After that, the stacked plate-assembly is irradiated by a laser beam 15 from outside so that the silicon film 13 is molten and recrystallized to form a single crystal silicon structure on the plate 11.

In accordance with the embodiment of FIG. 7, it becomes possible to raise the heat radiation effect from the molten portion 16 to the sapphire plate 14. Therefore, in the process of cooling and recrystallizing the molten portion 16, the crystallizing starts from the sapphire plate side, which contributes to precisely and reliably transfer the crystalline characteristic from the sapphire plate 14 to the recrystallized structure.

FIGS. 8a to 8d represent a still further embodiment of the present invention.

Figure 8A:
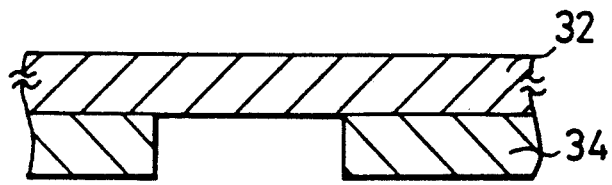
FIGS. 8a to 8d are sectional views of the structure at different steps in the flow of process for producing the single crystal silicon film in accordance with a still further embodiment of the present invention.

FIG. 8a illustrates the structure at a step of the process in accordance with the embodiment of the invention. A silicon oxide film 34 is formed on the sapphire plate 32 as a mask member. The film 34 is patterned to form the mask having openings corresponding to the active regions of the SOI substrate to be formed later by the photoengraving process and the etching process.

Figure 8B:
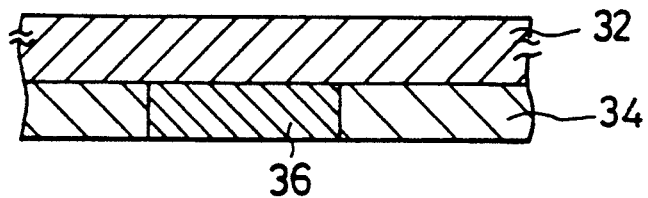

FIG. 8b illustrates the structure at a step subsequent to the step of FIG. 8a. A single crystal silicon film 36 is formed on the sapphire plate 32 through the mask opening by an epitaxial process such as thermal decomposition of SiH$_4$. The thickness of the film 36 is the same as that of the film 34. Or otherwise, the film 36 is formed thinner than the film 34 first and after that the film 34 is etched to protrude the film 36, as described later with reference to FIG. 11. The thickness of the film 36 is determined considering the sapphire plate separation process and the depth of the active region of the SOI substrate. For example, the film 36 is about 3000 Å thick.

Figure 8C:
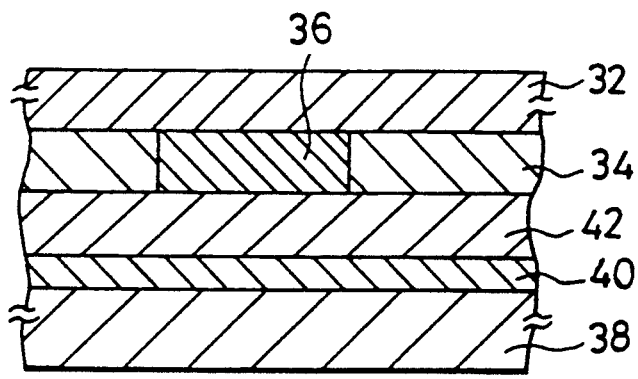

FIG. 8c illustrates the structure at another step of the process in accordance with the embodiment of the invention. In addition to the plate 32, a silicon plate 38 is prepared on which plate 38 a silicon nitride film 40 is deposited to about 100 to 200 Å thick by a CVD process and on which film 40 an amorphous silicon film 42 is deposited to about 1000 to 5000 Å thick by the CVD process. The silicon nitride film 40 is arranged to function as the affinitive insulation film which has a strong affinity for the silicon film.

A pretreatment process for cleaning the film surfaces is conducted so that the surfaces of the films 34, 36, and 42 are washed and cleaned by an appropriate detergent such as buffered hydrofluoric acid.

Immediately after the pretreatment process, the two plates 32 and 38 are superposed together so that the film 36 of the plate 32 comes in direct contact with the film 42 of the plate 38.

In such a state, the film 42 is molten and recrystallized to form a single crystal structure. The film 42 is molten by, for example, an argon laser beam having an optical output power of about 2 to 4 W and irradiating the film 42 through the plate 32. At the time of recrystallization of the film 42, the sapphire plate 32 and the unmelted silicon film 36 function as the seed of the crystalline nuclear so that the crystal axis of the recrystallized single crystal silicon can be well controlled.

Figure 8D:
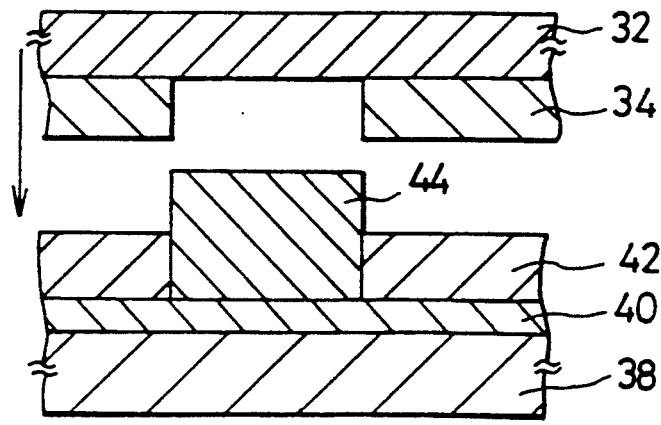

FIG. 8d illustrates the structure at another step subsequent to the step of FIG. 8c. After the film 42 is molten and recrystallized to form a single crystal structure, the plate 32 is separated from the plate 38. Numeral 44 designates a single crystal silicon film which is formed by melting and recrystallizing the film 42, as mentioned above. The film 44 is bonded to the side of the plate 38 on which the silicon nitride film 40 is arranged which film 40 has a stronger affinity for the silicon than the sapphire plate 32 so that the film 44 is certainly separated from the plate 32. In that way, it becomes possible to reliably obtain an SOI structure in which a plurality of single crystal silicon films 44 are dispersed like islands formed on the insulation film (silicon nitride film) 40 on the plate 38.

In the step of FIG. 8c wherein the film 42 is to be molten and recrystallized, in the event that the plate 38 has no semiconductor elements preformed thereon, the film 42 may be heated by a heater device instead of the laser beam irradiation as mentioned above. The film 42 may be heated by the heater from either the plate 32 side or the plate 38 side.

When the laser beam is used, since the beam diameter is so small as several μm, it takes long time to scan all over the sample surface.

On the other hand, when the heater is used instead of the laser beam, it becomes possible to heat all over the sample surface at a time, which shortens the time for recrystallization process and also reduces the cost for production.

Figure 9:
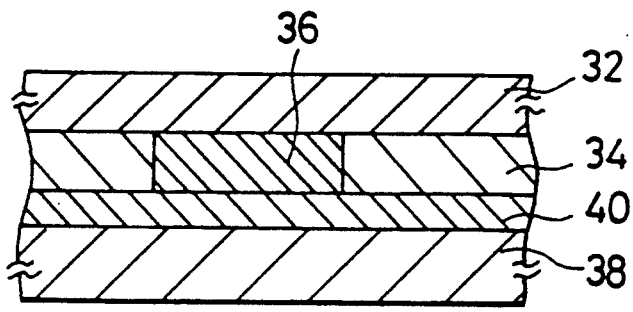
FIG. 9 is a sectional view of the structure at a step in the flow of process for producing the single crystal silicon film in accordance with a still further embodiment of the present invention.

FIG. 9 represents a still further embodiment of the present invention.

The embodiment of FIG. 9 is different from the embodiment of FIG. 8 in that, as the second substrate, a plate without an amorphous or polycrystalline film formed thereon is used, such as a silicon plate 38 having a silicon nitride film 40 formed thereon.

A silicon oxide film 34 is formed on the sapphire plate 32 as a mask member. The film 34 is patterned to form the mask having openings therein. A single crystal silicon film 36 is formed on the plate 32 through the opening of the film 36 and fills the opening. The surfaces of the films 34, 36 and 40 are cleaned. After that, the plate 32 is superposed on the plate 38 so that the film 36 comes in direct contact with the film 40. In that state, the film 36 is molten and recrystallized with the use of either the laser beam or the heater device.

After that, the plate 32 is separated from the plate 38 so as to obtain an SOI substrate comprising a plurality of single crystal silicon films dispersingly formed like islands on the film 40 of the plate 38.

In the embodiment of FIG. 9, the film 36 formed on the plate 32 is thicker than that of FIG. 8.

Figure 10:
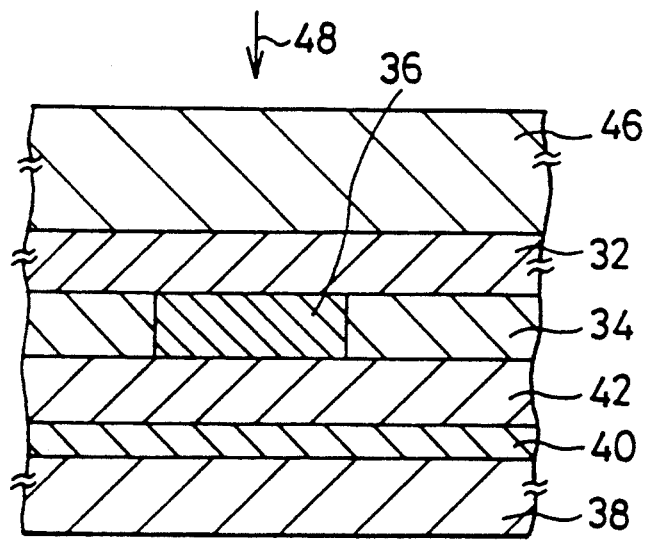
FIG. 10 is a sectional view of the structure at a step in the flow of process for producing the single crystal silicon film in accordance with a still further embodiment of the present invention.

FIG. 10 represents a still further embodiment of the present invention.

The arrangement of the sapphire plate 32 and the glass plate 38 are substantially the same as that of the embodiment of FIG. 8. A laser beam 48 is irradiated to the combined structure of plates 32 and 38 and scans the plates. In this scanning operation, a liquid cooling medium 46 such as polyethylene glycol is disposed in direct contact with the upper surface of the plate 32.

Due to the arrangement of the cooling medium 46, the molten portion is more rapidly cooled from the plate 32 side, which results in that the plate 32 functions more effectively as the seed for crystal nuclear, thereby the crystal axis is more precisely and reliably taken over from the plate 32 to the recrystallized single crystal silicon film.

The film 36 which is partly formed in the selected portion is molten and recrystallized to form a active region of the SOI structure. Therefore, impurities may be doped in the film 36 in advance.

Depending on the conditions of melting and recrystallizing the film 36, the mask member of film 34 may be transferred to the plate 38 side. However, this is no problem. Instead, this is rather advantageous since the active regions are reliably isolated from each other by the mask member.

It is not easy to control the height of the film 36 when depositing the film on the plate 32. This is explained in detail below.

Figure 11A:
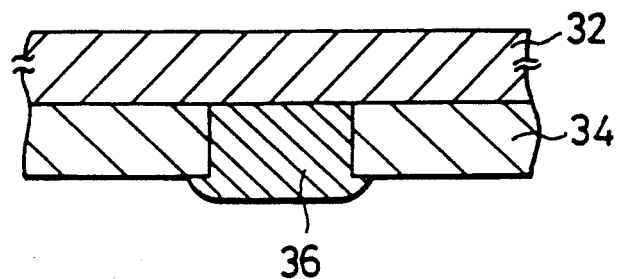
FIGS. 11a to 11c are sectional views of the structure at different steps in the flow of process for producing the single crystal silicon film in accordance with a still further embodiment of the present invention.

As illustrated in FIG. 11a, in the event that the film 36 is deposited on the plate 32 more thick than the film 34, the film 36 spreads horizontally, which results in the misdimension or misalignment of the structure in the horizontal direction.

Figure 11B:
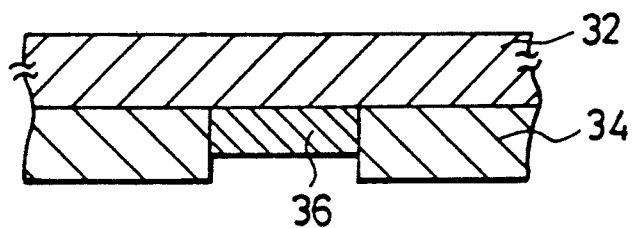

Therefore, to cope with the problem, the film 36 is deposited thinner than the film 34, as illustrated in FIG. 11b.

Figure 11C:
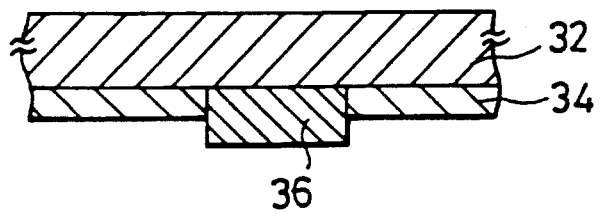

After that, the film 34 is etched so that the film 36 is protruded from the film 34, as illustrated in FIG. 11c, whereby the film 36 comes in reliable contact with the second substrate surface and besides accuracy of the dimension in horizontal direction can be raised.

It is to be noted that when the plate 32 of FIG. 11c is superposed on the mating second plate, a gap is formed between the film 34 and the second plate and the gas sealed in the gap may be expanded in the heating process, which impairs the quality of the products. To avoid this problem, it is desirable that the two plates be combined together in a vacuum state.

Figure 12A:
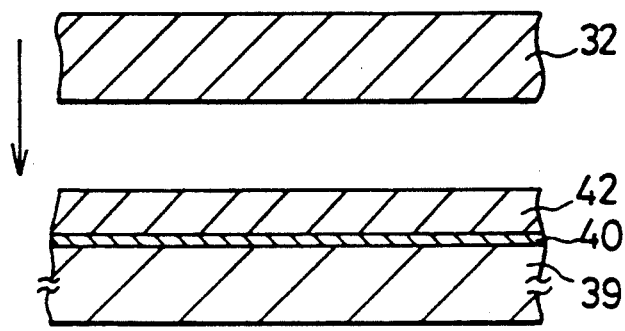
FIGS. 12a to 12c are sectional views of the structure at different steps in the flow of process for selectively producing the single crystal silicon film on the sapphire substrate in accordance with a still further embodiment of the present invention.
Figure 12B:
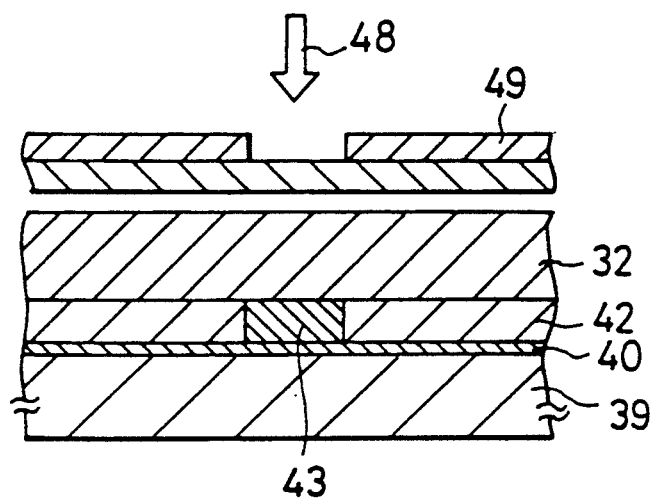
Figure 12C:
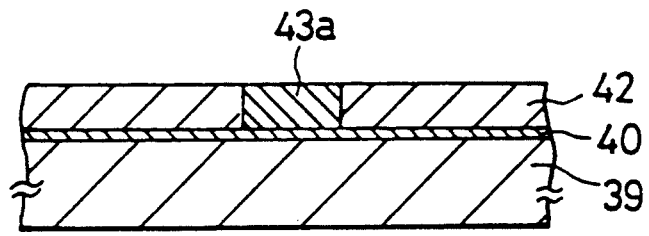
Figure 13:
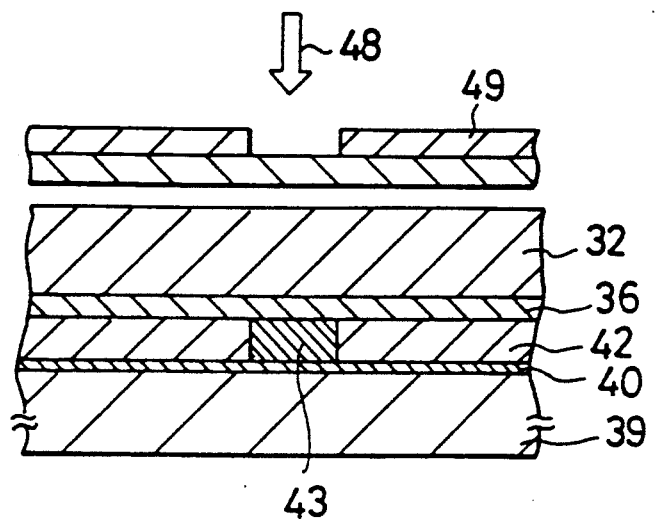
FIG. 13 is a sectional view of the structure at a step in the flow of process for selectively producing the single crystal silicon film on the sapphire substrate in accordance with a still further embodiment of the present invention.

FIGS. 12 and 13 represents a still further embodiment of the present invention wherein the crystal axis orientation is controlled by giving the seed for crystal nuclear from outside and the single crystal silicon film can be patterned simultaneously with the recrystallization thereof.

In accordance with this embodiment, a polycrystalline or amorphous silicon film is formed on an insulation base member. A sapphire plate or a single crystal silicon film formed on the sapphire plate by an epitaxial growth process is disposed on the silicon film of the base member in direct contact with the silicon film. In this state, an energy beam is irradiated to the film through a mask. The silicon film is molten and recrystallized to form a single crystal structure. After that, the sapphire plate is separated from the base member. As the energy beam, a laser beam or other optical beams may be used.

The embodiment of the invention is further described with reference to FIGS. 12a to 12c.

FIG. 12a illustrates the structure at a step of the process in accordance with the embodiment of the present invention. On a glass plate 39, a silicon nitride film 40 is deposited to about 100 to 200 Å by a CVD process. Further, on the film 40, an amorphous silicon film 42 is deposited to about 1000 to 5000 Å by the CVD process. Numeral 32 designates a sapphire plate of 0.3 mm thick prepared in addition to the glass plate 31.

FIG. 12b illustrates the structure at another step subsequent to the step of FIG. 12a. The surface of the film 42 and the surface of the plate 32 to be contacted with the film 42 are washed and cleaned by an appropriate detergent such as buffered hydrofluoric acid in advance. Immediately after the pretreatment of the film surfaces, the plate 32 is superposed on the plate 39 so that the plate 32 comes in direct contact with the film 42 of the plate 39.

In that state, an argon laser beam 48 is irradiated to the combined plates through the mask 49 so that the film 42 is molten. The mask 49 is, for example, composed of a glass plate on which a mask pattern is formed from a Cr film. The mask of Cr film has pattern openings corresponding to the portions where the semiconductor elements are to be formed later. The laser beam irradiating conditions are such that the output power is 2 to 10 W, scanning speed is 20 mm/sec, and the beam diameter is 5 to 10 μm. Numeral 43 designates the molten portion melted by the energy of the laser beam 48. The molten portion 43 is cooled and recrystallized to form a single crystal structure.

After that, as illustrated in FIG. 12c, the plate 32 is removed from the plate 39 so as to obtain the glass plate 39 on which a single crystal silicon film 43a is formed in a predetermined pattern through the silicon nitride film 40.

With regard to the active matrix type liquid crystal display device, it is necessary to form a plurality of active elements such as thin film transistors or diodes on the glass substrate in a matrix arrangement. In the event that the active elements are formed from the amorphous silicon film, the characteristic of the elements becomes not uniform and different for every element since the shifting amount of the carrier and the oxidation speed are spatially different in the substrate.

To cope with this problem, in accordance with the embodiment of FIGS. 12, the laser beam is irradiated through the Cr mask which has pattern openings formed at the positions corresponding to the active regions where the transistors or diodes are to be formed so that the active regions are molten and recrystallized to form a single crystal structure.

FIG. 13 illustrates a variant of the embodiment of FIG. 12.

In accordance with the method of FIG. 13, a single crystal silicon film 36 is deposited on the sapphire plate 32 to about 3000 Å by an epitaxial growth process, first. Then, the film 36 is arranged to come in direct contact with the amorphous (or polycrystalline) silicon film 42. The film surfaces to be contacted together are washed and cleaned by buffered hydrofluoric acid in advance.

After that, the laser beam 48 is irradiated to the combined plates through the mask 49 so as to melt and recrystallize the silicon film to form a single crystal structure, as in the case of FIGS. 12.

In accordance with the embodiment of FIGS. 12 or FIG. 13, it becomes possible to form a minute pattern without undergoing the photoengraving process or the etching process, by using a mask having a pattern to be formed through which mask the energy beam is irradiated to the film to be melted and recrystallized. Therefore, the polycrystalline or amorphous silicon film may be formed all over the insulation base plate.

Figure 14:
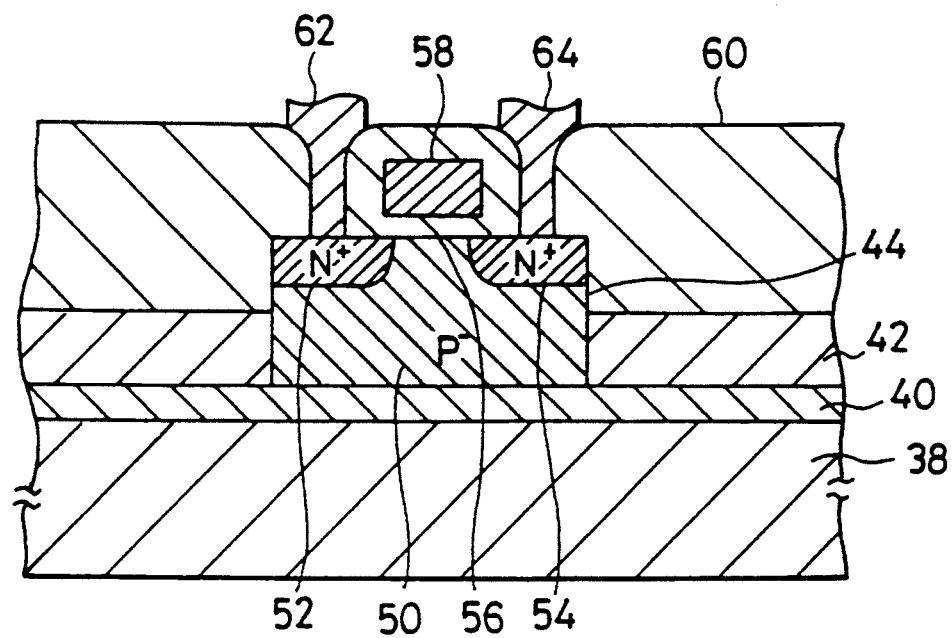
FIG. 14 is a sectional view of an NMOS transistor constituted from the SOI structure in accordance with the present invention.

FIG. 14 illustrates an NMOS transistor having the SOI structure formed in accordance with the embodiment of FIG. 8.

P-type impurities are doped in the single crystal silicon film 44 which is produced as mentioned above according to the embodiment of FIG. 8 so as to form a P-well 50 in the film 44. Also, N+ diffusion layers 52 and 54 are formed to constitute the source and drain regions.

A gate electrode 58 made from polycrystalline silicon is formed above the gate oxide film 56. Aluminium wirings 62 and 64 are connected to the source 52 and the drain 54, respectively, through contact holes.

The dimension of the NMOS transistor of FIG. 14 is such that the thickness of the film 44 is about 8000 Å, the thickness of the film 40 is about 200 Å, and the thickness of the film 42 is about 5000 Å, respectively.

The single crystal silicon film in accordance with the present invention can be applied to various semiconductor devices other than the MOS transistor.

By interposing a silicon nitride film 40 between the recrystallized single crystal silicon and the silicon plate 38 or the glass plate 39, due to the strong affinity of the film 40 for silicon, it becomes possible to prevent the film 44 from being removed from the plate 38 side and transferred to the plate 32 side at the time when the plates 32 and 38 are separated from each other.

Many widely different embodiments of the present invention may be constituted without departing from the spirit and scope of the present invention. It should be understood that the present invention is not limited to the specific embodiments described in the specification, except as defined in the appended claims.

What is claimed is:

1. A method for producing a semiconductor single crystal film comprising the steps of:
   (a) preparing a first substrate and a second substrate, wherein said first substrate having a surface at least partially comprising a semiconductor layer;
   (b) superposing said first substrate on said second substrate to form an assembly of substrates combined in such a manner that said semiconductor layer contacts a surface of said second substrate;
   (c) applying energy to said assembly of substrates to form a molten portion of said semiconductor layer therein;
   (d) cooling said molten portion to crystallize said molten portion of said semiconductor layer to form a single crystal semiconductor structure therein; and
   (e) separating said first substrate from said second substrate.

2. A method for producing a semiconductor single crystal film according to claim 1, wherein said second substrate comprises a plate member and an electrically insulating film formed thereon which has a stronger affinity for said single crystal formed in said molten portion than that of said first substrate.

3. A method for producing a semiconductor single crystal film according to claim 1, wherein said second substrate comprises a plate member and an amorphous silicon film formed thereon.

4. A method for producing a semiconductor single crystal film according to claim 1, wherein said first substrate has at least one protrusion at a portion corresponding to said molten portion.

5. A method for producing a semiconductor single crystal film according to claim 1, wherein a cooling means is disposed on the first substrate side while applying said energy to said assembly of substrates.

6. A method for producing a semiconductor single crystal film according to claim 1, wherein said first substrate comprises a sapphire plate.

7. A method for producing a semiconductor single crystal film according to claim 6, wherein said first substrate further comprises a single crystal silicon film formed on said sapphire plate.

8. A method for producing a semiconductor single crystal film comprising the steps of:
  (a) preparing a first substrate and a second substrate, wherein said first substrate is essentially constituted by a single crystal and having a surface at least partially comprising a semiconductor layer;
  (b) superposing said first substrate on said second substrate to form an assembly of substrates combined in such a manner that said semiconductor layer contacts a surface of said second substrate;
  (c) applying energy to said assembly of substrates to form a molten portion of said semiconductor layer therein;
  (d) cooling said molten portion so as to crystallize said molten portion of said semiconductor layer while imparting a crystal orientation of single crystal of said first substrate to said molten portion thereby to form a single crystal semiconductor structure in said molten portion; and
  (e) separating said first substrate from said second substrate.

9. A method for producing a semiconductor single crystal film according to claim 8, wherein said second substrate comprises a plate member and an electrically insulating film formed thereon which has a stronger affinity for said single crystal formed in said motion portion than that of said first substrate.

10. A method for producing a semiconductor single crystal film according to claim 9, wherein said second substrate further comprises an amorphous film formed on said insulating film.

11. A method for producing a semiconductor single crystal according to claim 9, wherein said second substrate further comprises a polycrystalline silicon film formed on said insulating film.

12. A method for producing a semiconductor single crystal film according to claim 8, wherein said second substrate comprises a plate member and a polycrystalline silicon film formed thereon.

13. A method for producing a semiconductor single crystal film according to claim 8, wherein said second substrate comprises a plate member and an amorphous silicon film formed thereon.

14. A method for producing a semiconductor single crystal film according to claim 8, wherein said first substrate has at least one protrusion at a portion corresponding to said molten portion.

15. A method for producing a semiconductor single crystal film according to claim 8, wherein an energy beam is used to form said molten portion.

16. A method for producing a semiconductor single crystal film according to claim 15, wherein a cooling means is disposed on the first substrate side while applying said energy to said assembly of substrates.

17. A method for producing a semiconductor single crystal according to claim 15, wherein said energy beam is irradiated to said assembly through a mask having a pattern of a single crystal film to be formed on said second substrate.

18. A method for producing a semiconductor single crystal film according to claim 8, wherein said first substrate comprises a sapphire plate.

19. A method for producing a semiconductor single crystal film according to claim 18, wherein said first substrate further comprises a single crystal silicon film formed on said sapphire plate.

* * * * *